United States Patent [19]

Wittig

[11] Patent Number: 4,481,477
[45] Date of Patent: Nov. 6, 1984

[54] METHOD AND APPARATUS FOR THE REAL-TIME MEASUREMENT OF THE SMALL SIGNAL GAIN OF AN AMPLIFIER

[75] Inventor: Karl R. Wittig, New York, N.Y.

[73] Assignee: North American Philips Corporation, New York, N.Y.

[21] Appl. No.: 358,541

[22] Filed: Mar. 15, 1982

[51] Int. Cl.³ ............................................. G01R 19/00
[52] U.S. Cl. .................................... 330/2; 330/207 R; 330/278
[58] Field of Search ......................... 330/2, 207 R, 278

[56] References Cited

U.S. PATENT DOCUMENTS 4,109,213 8/1978 Holley et al. ............................ 330/2

Primary Examiner—James B. Mullins
Assistant Examiner—G. Wan
Attorney, Agent, or Firm—Marc D. Schechter

[57] ABSTRACT

A method and apparatus for measuring the small signal gain of an amplifier. Each amplifier responds, in operation, to a small signal input. The small signal input varies substantially linearly over a field time interval. A small bias signal is added to the bias level input of the amplifier during a portion of the field time interval. The output of the amplifier is measured at three or more different times during the field time interval, at least one time when the small bias signal has not been added to the bias level input and at least one time being when the small bias signal has been added to the bias level input. By processing the measured outputs, a signal which is directly proportional to the product of the small bias signal with the small signal gain of the amplifier is obtained. A method and apparatus for actively compensating for differences in the small signal gain among two or more amplifiers is obtained by dividing the small signal output of each amplifier by the signal proportional to the small signal gain of the amplifier.

6 Claims, 6 Drawing Figures

METHOD AND APPARATUS FOR THE REAL-TIME MEASUREMENT OF THE SMALL SIGNAL GAIN OF AN AMPLIFIER

The U.S. Government has rights in this invention pursuant to Contract No. DAAK 70-78-C-0011 awarded by the U.S. Army Night Vision and Electro-Optics Laboratory.

BACKGROUND OF THE INVENTION

The invention relates to a method and apparatus for actively measuring the small signal gain of an amplifier. That is, the invention relates to a method and apparatus for periodically measuring the small signal gain of an amplifier while the amplifier is in operation. The invention also relates to a method and apparatus for actively compensating for differences in the small signal gain among two or more amplifiers.

In recent years, much work has been performed on the development of solid state imaging devices. These devices have been proposed in many forms, depending upon the requirements of the particular application involved. In the field of solid state infrared imaging devices, a device has been proposed and built in which an X-Y addressable array of junction field effect transistors (JFET's) is provided with a pyroelectric target material. This device is disclosed in an article entitled "Solid-state pyroelectric imaging system" by A. Carlson et al. (Proceedings of SPIE, Vol. 267 Staring Infrared Focal Plane Technology, 1981).

The use of an array of JFET's is advantageous, among other reasons, because it greatly reduces amplifier noise. This is achieved because JFET's are inherently low-noise devices, and because an array of JFET's can provide individual amplification of each pyroelectric channel before multiplexing. However, in the use of a JFET array, other problems arise. These problems are the nonuniformities in the characteristics of the individual JFET's (or other amplifiers) in the array. There are two kinds of nonuniformities, namely offset and gain. While offset nonuniformities are readily corrected in the known device, there is no method suggested in this article for correcting gain nonuniformities.

SUMMARY OF THE INVENTION

It is an object of the invention to provide a method and apparatus for actively measuring the small signal gain of an amplifier.

It is another object of the invention to provide a method and apparatus for compensating for differences in the small signal gain among two or more amplifiers.

It is yet a further object of the invention to provide a method and apparatus for actively compensating for the differences in the small signal gains among two or more amplifiers, while the amplifiers are in operation.

According to the invention, a method and apparatus are provided for measuring the small signal gain of an amplifier which, in operation, responds to a small signal input variation about a bias level input. The small signal input varies substantially linearly over each field time interval.

The method according to the invention is performed by adding a small bias signal, $\Delta V$, to the bias level input during a portion of the field time interval. The output of the amplifier is then measured at a first time during the field time interval when the bias signal, $\Delta V$ has not been added to the bias level input. This produces a first measured output.

The output of the amplifier is also measured at a second time during the field time interval to produce a second measured output. The bias signal, $\Delta V$ has been added to the bias level input at the second time. Moreover, the output of the amplifier is measured a third time to produce a third measured output. The third time is different from the first and second times, but it does not matter whether or not the bias signal, $\Delta V$, has been added to the bias level input at the third time.

According to the invention, each of the three measured outputs is multiplied by a respective preselected fixed number to produce weighted measured outputs. These weighted measured outputs are then added in such a way that the sum is a signal which is directly proportional to the product of the bias signal, $\Delta V$, with the small signal gain of the amplifier during the field time interval. (As used herein, an output signal is "directly proportional" to the small signal gain when the output signal is equal to the small signal gain multiplied by one or more constant factors.)

The method of active compensation according to the invention is performed by first producing, by the preceding method, a signal which is directly proportional to the small signal gain of each amplifier. Compensation is then achieved by dividing the small signal output of each amplifier by the signal proportional to the small signal gain of the amplifier. This process is repeated for each and every field time interval while the amplifiers are in use. Consequently, the process not only compensates for differences in gain between amplifiers, but it also compensates for changes in the gain of a single amplifier over time.

An apparatus for measuring the small signal gain of an amplifier during operation of the amplifier includes means for adding a small bias signal, $\Delta V$, to the bias level input during a portion of the field time interval. Such an apparatus further includes means for measuring the first, second and third measured outputs, described above, and means for multiplying each measured output by the respective preselected fixed numbers to produce weighted measured outputs. Finally, the apparatus includes means for adding the weighted measured outputs to produce a signal which is directly proportional to the small signal gain of the amplifier. Digital electronics can be easily designed to perform these functions.

An apparatus according to the invention for active gain compensation includes the apparatus for measuring the small signal gain of each amplifier, as well as means for dividing the small signal output of each amplifier by the signal proportional to the small signal gain of the amplifier. Either an analog or digital divider can perform this latter function.

DESCRIPTION OF THE PREFERRED EMBODIMENTS

The method of measuring the small signal gain of an amplifier in real-time is based upon measuring this gain once during each field time interval. The field time interval may be any preselected length of time. However, the effectiveness of this method is based upon the assumption that during the field time interval, the small signal input to the amplifier varies substantially linearly. The closer the small signal input approximates a linear variation, the more accurate will be the small signal gain measurement during the field time interval.

Figure 1:
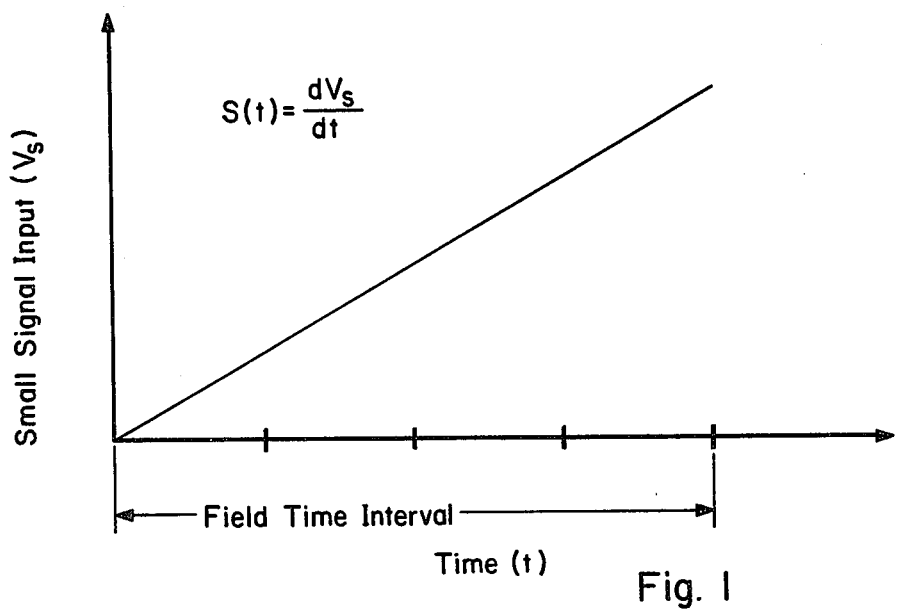
FIG. 1 is a graph showing an approximation of the small signal input to the amplifier whose gain is being measured according to the invention.

FIG. 1 shows a small signal input which varies linearly over a field time interval. The field time interval is shown divided into four equal segments. The slope of the curve shown in FIG. 1, which is the change in the small signal input with time, is denoted by the function $S(t)$. As will be discussed further below, the small signal generated by a pyroelectric target material can be made to closely approximate a straight line over a field time interval.

Figure 2:
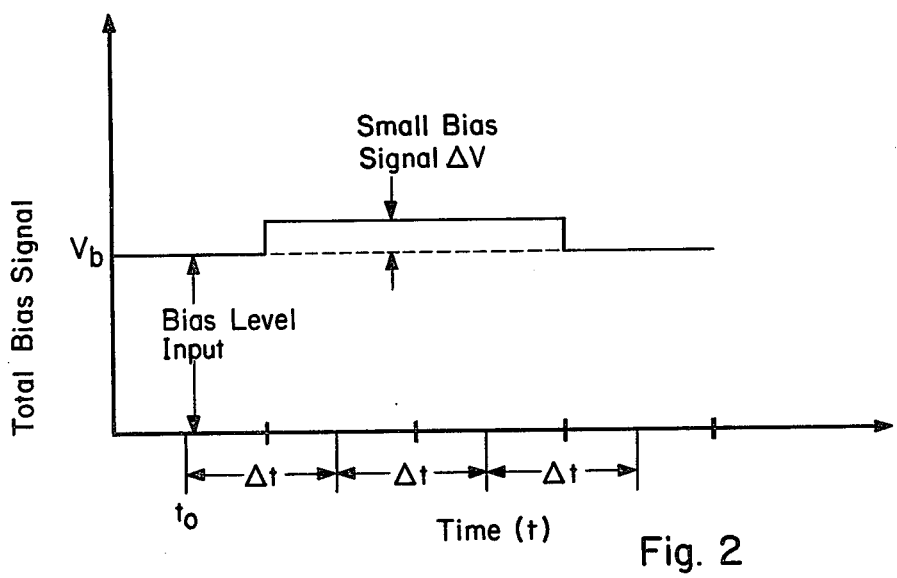
FIG. 2 is a graph showing the total bias signal applied to the amplifier, which is the sum of the bias level input and the small bias signal, $\Delta V$.

FIG. 2 is a graph showing a typical total bias signal applied to the amplifier in order to measure the amplifier's gain. Preferably, during one half of the field time interval, the total bias signal is equal to the bias level input. During the other half of the field time interval, the total bias signal is equal to the sum of the bias level input, $V_b$, and the small bias signal, $\Delta V$.

Where the amplifier is a JFET, the small signal input and the total bias signal are both voltage signals. However, in general they may be any form of electrical signal.

In order to obtain a signal which is directly proportional to the small signal gain of the amplifier during the field time interval, it is preferred that four measurements of the output of the amplifier are taken during the field time interval. Each measurement is taken in the middle of each quarter of the field. Thus, each of the four measured outputs will be given by the following equations:

$$I(to) = I_o$$

$$I(to + \Delta t) = I_o + gm[\Delta V + S(t)\Delta t]$$

$$I(to + 2\Delta t) = I_o + gm[\Delta V + 2S(t)\Delta t]$$

$$I(to + 3\Delta t) = I_o + gm[3S(t)\Delta t]$$

In these equations, $I_o$ is the amplifier's output due to the bias level input (and possibly leakage). The quantity $g_m$ represents the small signal gain of the amplifier during the field time interval. The symbol $\Delta V$ represents the small bias signal, which is added to the bias level input during the second and third quarters of the field time interval. The symbol $\Delta t$ represents the time interval between each measurement. This time interval is equal to one fourth of the field time interval in the preferred embodiment of the invention. Finally, $S(t)$ represents the rate of change of the small signal input with time, as discussed above.

Now, the gain-proportional output signal can be obtained by adding the second and third measured outputs (each multiplied by $+1$) and subtracting from this sum both the first and fourth measured outputs (i.e. adding the first and fourth measured outputs, each multiplied by $-1$).

$$I(to+\Delta t)+I(to+2\Delta t)+(-1)I(to)+(-1)I(to+3\Delta t)=2g_m\Delta V \text{ (gain-proportional signal)}$$

The resulting output signal is equal to two times the small signal gain during the field time interval multiplied by the small bias signal, $\Delta V$. Since the small bias signal is known, the small signal gain can easily be obtained from this output signal.

While the preferred method of the invention makes use of four measurements during each field time interval, it should be readily apparent from the above discussion that only three measurements are necessary in order to obtain a signal which is directly proportional to the small signal gain. This follows from the fact that each measured output includes components which make up three unknowns, namely the signal component due to the bias level input (and possibly leakage), the small signal input itself, and the small signal gain during the field time interval.

For example, a gain-proportional signal, $g_m\Delta V$ can be obtained by multiplying the second measured output by two and then adding to this both the first and third measured outputs, each multiplied by $-1$.

$$2[I(to+\Delta t)]+(-1)I(to)+(-1)I(to+2\Delta t)=g_m\Delta V$$

When the measurements are in the form of digital signals, as is preferred, a multiplication by two is performed by a simple "arithmetic shift left" operation. In order to multiply by $-1$ digitally, a simple "2's complement" operation is performed.

Moreover, the three measurements taken during the field time interval need not be separated by equal times, $\Delta t$. So long as the time between measurements is known, the gain-proportional signal can be obtained merely by the selection of an appropriate multiplier for each measurement. For similar reasons, the small bias signal, $\Delta V$, may be added to the bias level inputs at any time during the field time interval.

It is important, however, that at least one measurement is taken when the total bias signal is equal to the bias level input, and that another measurement is taken when the total bias signal is equal to the sum of the bias level input plus the small bias signal, $\Delta V$. Absent this requirement, there would be no way to obtain the value of the small signal gain according to the invention.

Figure 3:
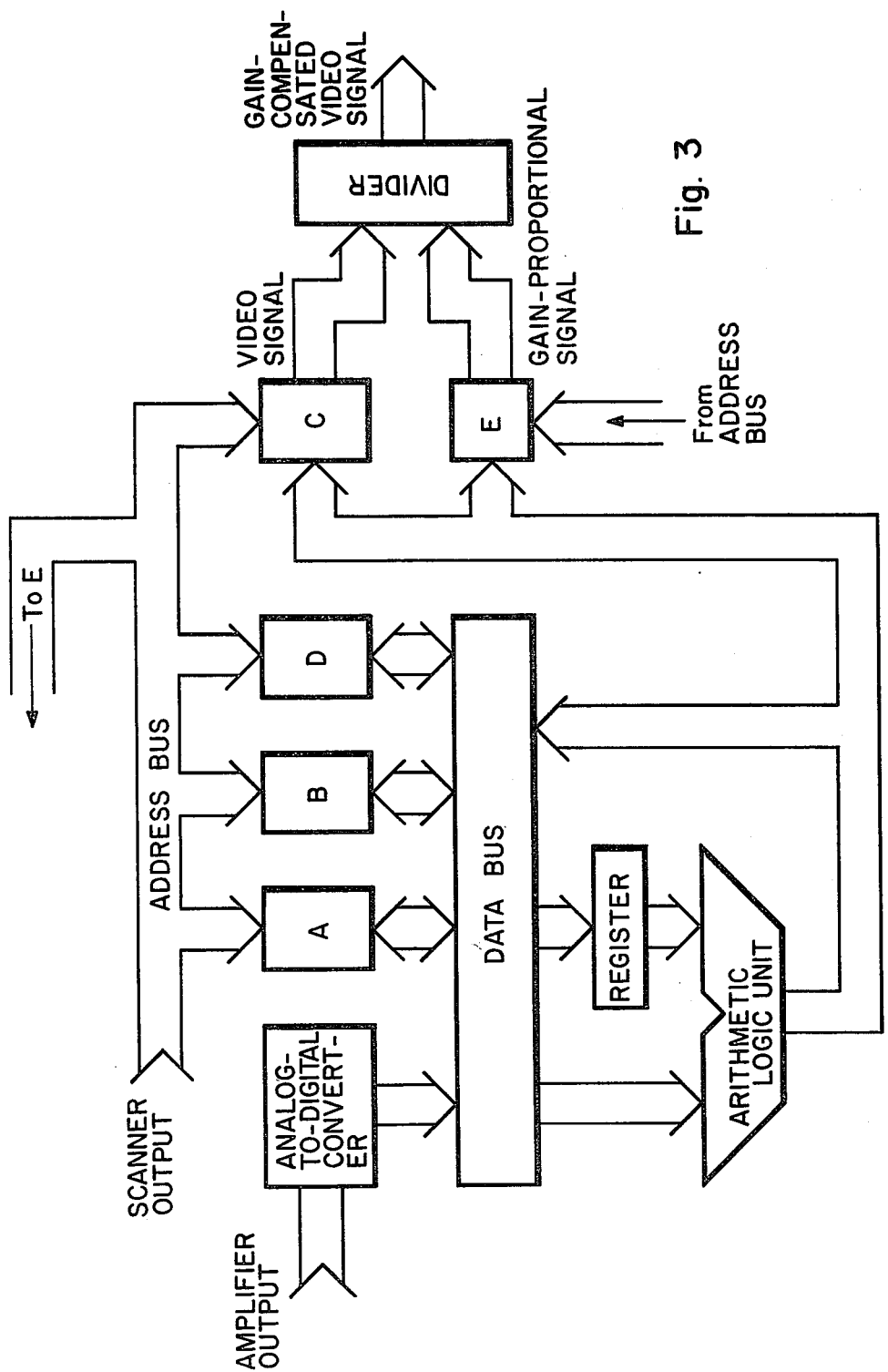
FIG. 3 is a schematic diagram showing the flow of data according to the invention from the output of the amplifier to both a gain-proportional signal and a gain-compensated video signal.

FIG. 3 is a schematic diagram showing the flow of measurement data according to the method and apparatus of the invention. This flow applies to the data from each amplifier when an array of amplifiers is used. First, the output from the amplifier is continuously fed into an analog-to-digital converter. While this is proceeding, a scanner (clock) is sequentially feeding address signals into an address bus. In this way, each time the output of the amplifier is measured during a field time interval, either the value of the output itself or the result of some arithmetic operation performed on the output can be stored in a memory location defined by a unique address. In order to perform arithmetic operations on the supplied data, an arithmetic logic unit and a register are provided. The arithmetic logic unit is preprogrammed to perform the following sequence of operations in order to calculate the gain-proportional signal when four measurements are taken according to the preferred embodiment discussed above.

At the time of the first measurement, the output from the analog-to-digital converter (ADC) is transferred to either memory A or memory B (depending on whether the field is "even" to "odd").

Next, at the time of the second measured output, the first measured output from the current field (i.e. the contents of memory A or B) is transferred to the register. The second measured output from the amplifier is then read and fed into the ADC. The value of the contents of the register is subtracted from the value of the output of the ADC, and this difference is stored in memory D. Thus, memory D now contains the second measured output minus the first measured output.

At the time that the third measured output is taken, the contents of memory D are transferred to the register. The third measured output is then added to the register and the sum is then transferred to memory D. Now, memory D contains the sum of the second and the third measured outputs minus the first measured output.

At the time of the fourth measured output, the contents of memory D are again transferred to the register. Next, the value of the output of the ADC (i.e. the fourth measured output) is subtracted from the contents of the register to produce the signal equivalent to $2g_m\Delta V$. The value of this signal is then stored in memory E.

Just before or after the operations described in the preceding paragraph, the contents of memory A or B (depending on the field being even or odd) are transferred to the register and subtracted from the fourth measured output. This produces a "video" signal equivalent to $3g_m S(t)\Delta t$. (This is called a "video" signal because the use of an array of amplifiers with a pyroelectric imaging system is described, below.) Thus, $$I(t_0+3\Delta t)-I(t_0)=3g_m S(t)\Delta t.$$

This video signal is stored in memory C.

Now, by synchronizing (via the clock) the read-out of memories C and E corresponding to the same field time interval, the video signal (C can be divided by the gain-proportional signal (E) to produce a gain-compensated video signal, $3S(t)\Delta t/2\Delta V$. If this is performed by a digital division, no additional noise is added to the gain-compensated video signal. If the division is performed by an analog divider, it may be desireable to digitally "amplify" the video signal (by multiplication by a constant) prior to conversion back to an analog signal, so as to increase the signal-to-noise ratio.

Figure 4:
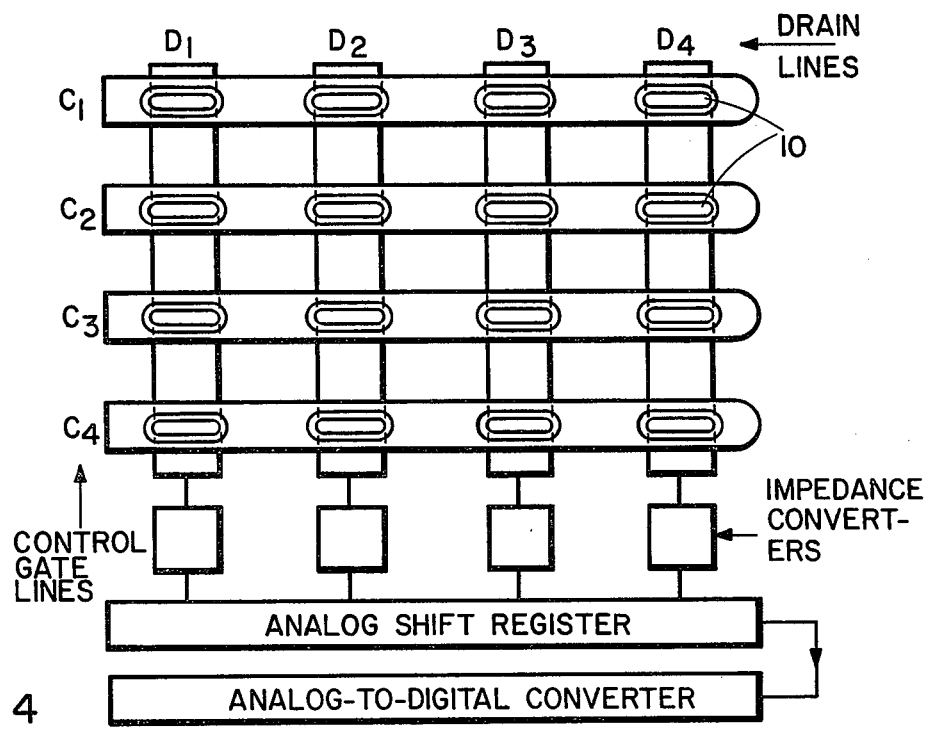
FIG. 4 is a schematic representation of an array of JFET's whose outputs are fed into an analog shift register.

While thusfar a method and apparatus have been described for actively measuring the small signal gain of an amplifier, the value of such a method and apparatus can be greatly appreciated when used in connection with an array of amplifiers. For example, FIG. 4 schematically shows an array of junction field effect transistors 10. Each JFET is provided with a source, a drain, a sense gate, and a control gate. (For simplicity, these are not shown.) It can be seen, however, from FIG. 4 that in each row of JFET's, each control gate is electrically connected to a common control gate line. Similarly, for each column of JFET's, each drain is electrically connected to a common drain line. Each drain line is then connected to a multiplexer such as an analog shift register, for example a bucket brigade device, via an impedance converter for matching the JFET drain impedance to the input impedance of the shift register.

In the operation of such an array, the control gate lines are energized sequentially. When one control gate line is energized, the outputs from all of the JFET's in the row travel in parallel into the shift register. The shift register then serially shifts these outputs to the analog-to-digital converter. After the shift register is emptied, the next control gate line is energized, repeating the process.

Such an array of JFET's can advantageously be used in connection with an imaging sensor, such as a pyroelectric target material. By providing the amplifiers immediately following the sensor outputs, signal noise can be minimized. However, by providing many individual amplifiers there is a high likelihood that there will be variations in the values of the small signal gains of the amplifiers. Hence, the method and apparatus for determining the value of the gain-proportional signal can be used to compensate for the gain nonuniformities among the JFET's.

Figure 6:
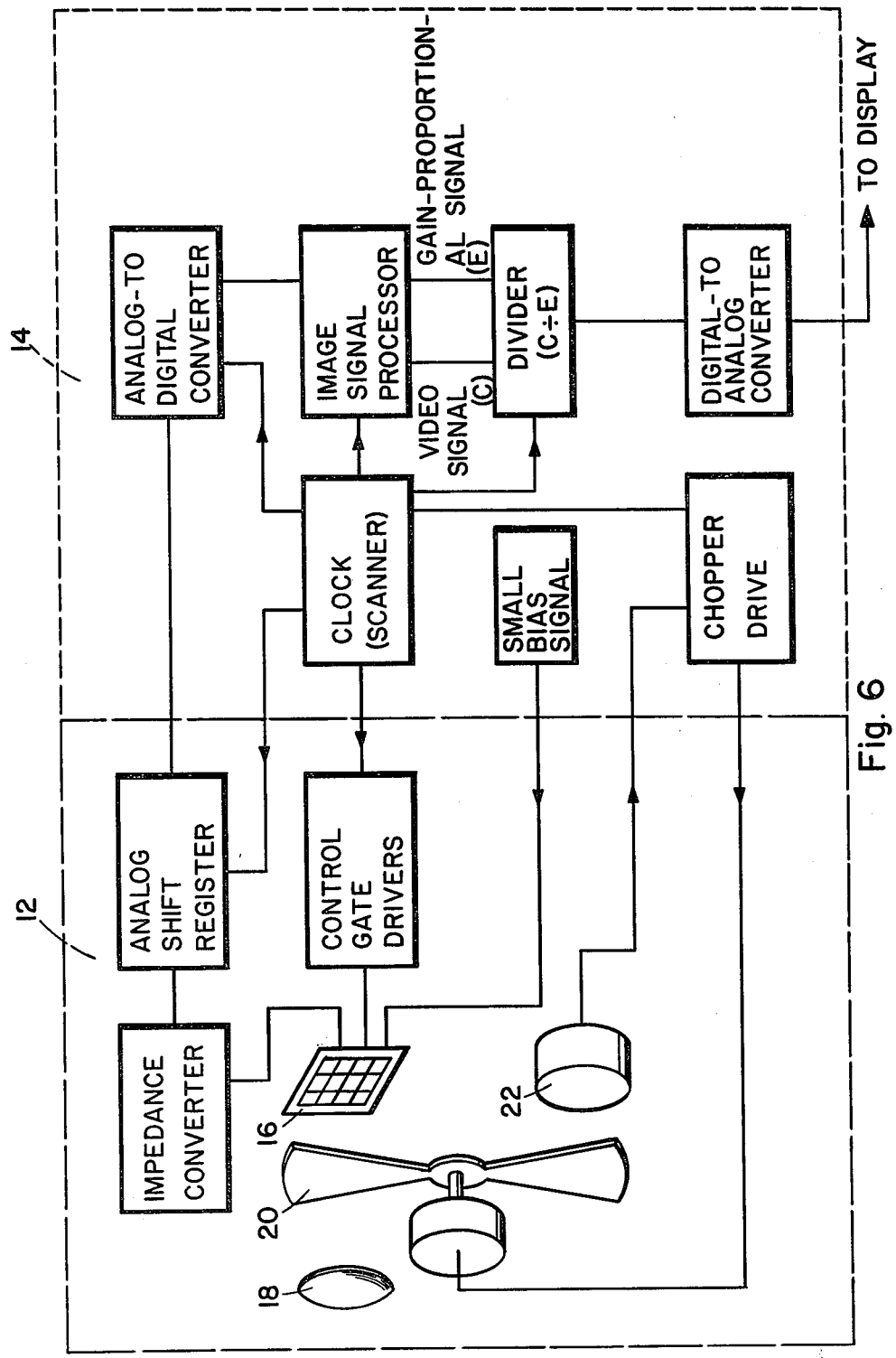
FIG. 6 is a schematic representation of a JFET pyroelectric imaging array provided with gain compensation according to the invention.

FIG. 6 is a schematic representation of a JFET pyroelectric imaging system provided with gain compensation. The system includes a camera head 12 and an external controller 14. The camera head includes a JFET array 16 having a pyroelectric target material provided thereon. A lens 18 focuses a thermal image onto the pyroelectric target.

As is well-known, pyroelectric materials produce output signals in response to changes in the temperature of the target material. Accordingly, a chopper 20 is provided to produce periodic changes in the temperature of the pyroelectric target by periodically blocking the thermal image from impinging on the target. An optical pickup 22 is provided for generating a feedback signal for use in synchronizing the chopper 20 with respect to the remainder of the imaging system.

Figure 5:
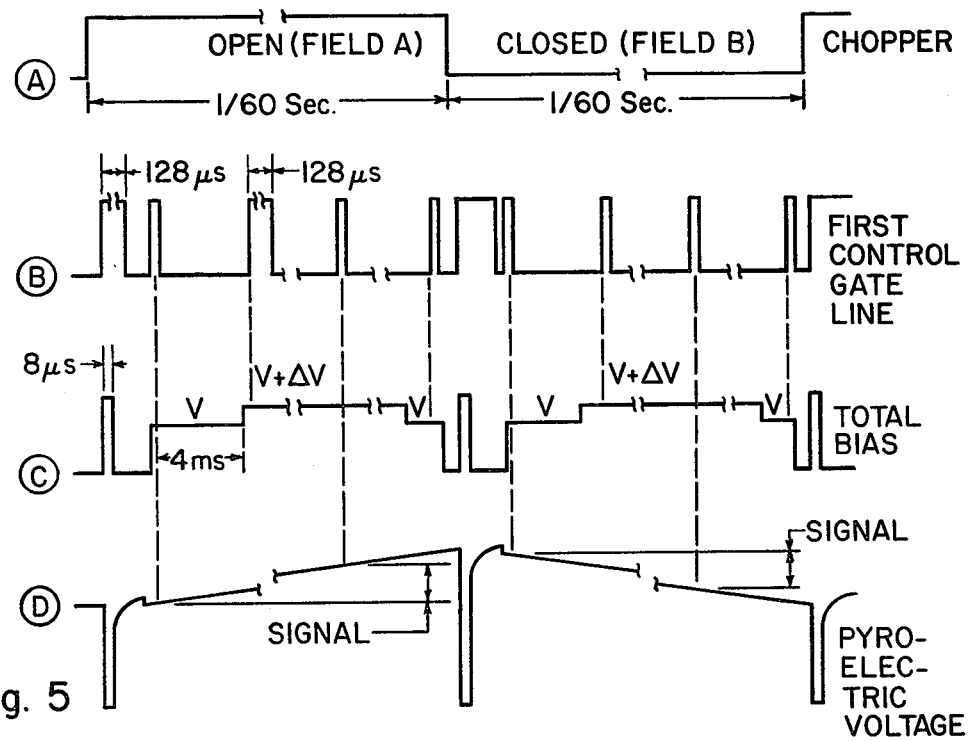
FIG. 5 is a series of graphs showing the relative timing between the shutter (chopper), the signal applied to the first control gate line, and the pyroelectric voltage of the pyroelectric target material.

Referring to FIG. 5, there is illustrated a series of graphs showing the relative timings between the chopper, the signal applied to the first control gate, the total bias, and the pyroelectric voltage of a typical portion of the pyroelectric target material. The operating cycle is made up of an open field A and a closed field B as shown in the top portion of FIG. 5. The time period of each field is chosen so that the pyroelectric voltage varies substantially linearly over most of the field time interval. This is shown in the bottom portion of FIG. 5 where the pyroelectric voltage increases substantially linearly during the open field and decreases substantially linearly during the closed field. The middle portion of FIG. 5 shows two occasions during each field when the first control gate line is energized in order to read the outputs of all JFET's in the first row. The 128 microsecond pulse applied to the control gate at the beginning of each field is a reset pulse; this is similar to the 64 microsecond reset pulse described in the article by A. Carlson et al.

Returning to FIG. 6, the external controller 14 is provided with a clock or scanner for synchronizing the operations of the chopper, the control gate drivers, the analog shift register, the analog-to-digital converter, the image signal processor (that is, the arithmetic logic unit, register, memories, and programming), and the digital divider. All of these elements are operated in the manner described in connection with FIG. 3. The only difference is that the series of output measurements from each amplifier are multiplexed with each other to produce a larger series of output measurements from all of the amplifiers in the array. Since each item of data is stored in a memory location having a unique address, the output measurements from each amplifier can easily be segregated from the output measurements of each other amplifier. For simplicity, each address can simply be taken as the value of the time interval between the measurement and the beginning of the cycle (one cycle being equal to two fields, an open field and a closed field).

I claim:

1. A method of actively measuring the small signal gain of an amplifier, said amplifier, in operation, responding to a small signal input variation about a bias level input, said small signal input varying substantially linearly over a field time interval, said method comprising the steps of:

adding a small bias signal, $\Delta V$, to the bias level input during a portion of the field time interval;

measuring the output of the amplifier at a first time during the field time interval to produce a first measured output, said first time being when the bias signal, $\Delta V$, has not been added to the bias level input;

measuring the output of the amplifier at a second time during the field time interval to produce a second measured output, said second time being when the bias signal, $\Delta V$, has been added to the bias level input;

measuring the output of the amplifier at a third time during the field time interval to produce a third measured output, said third time being different from the first and second times;

multiplying each measured output by a respective preselected fixed number to produce weighted measured outputs; and adding the weighted measured outputs in such a way that the sum is a signal which is directly proportional to the product of the bias signal, $\Delta V$, with the small signal gain of the amplifier during the field time interval.

2. A method as claimed in claim 1, characterized in that the first time is earlier than the second time, and the second time is earlier than the third time.

3. A method as claimed in claim 2, characterized in that:

the third time is a time when the bias signal, $\Delta V$, has been added to the bias level input; and the method further comprises the step of measuring the output at a fourth time during the field time interval to produce a fourth measured output, said fourth time being later than the third time and being a time when the bias signal, $\Delta V$, has not been added to the bias level input.

4. A method as claimed in claim 3, characterized in that:

the time intervals between the measuring steps are substantially constant; and the multiplying step comprises multiplying the first and fourth measured outputs by $-1$, and multiplying the second and third measured outputs by $+1$.

5. An apparatus for actively measuring the small signal gain of an amplifier, said amplifier responding, in operation, to a small signal input variation about a bias level input, said small signal input varying substantially linearly over a field time interval, said apparatus comprising:

means for adding a small bias signal, $\Delta V$, to the bias level input during a portion of the field time interval;

means for measuring the output of the amplifier at a first time during the field time interval to produce a first measured output, said first time being when the bias signal, $\Delta V$, has not been added to the bias level input;

means for measuring the output of the amplifier at a second time during the field time interval to produce a second measured output, said second time being when the bias signal, $\Delta V$, has been added to the bias level input;

means for measuring the output of the amplifier at a third time during the field time interval to produce a third measured output, said third time being different from the first and second times;

means for multiplying each measured output by a respective preselected fixed number to produce weighted measured outputs; and means for adding the weighted measured outputs in such a way that the sum is a signal which is directly proportional to the product of the bias signal, $\Delta V$, with the small signal gain of the amplifier during the field time interval.

6. An apparatus as claimed in claim 5, characterized in that:

the means for multiplying and the means for adding comprise an arithmetic logic unit; and the means for measuring comprise an analog-to-digital converter.

* * * * *